(12) United States Patent
Iwasaka et al.

(10) Patent No.: US 11,642,794 B2
(45) Date of Patent: May 9, 2023

(54) SUCTION DEVICE

(71) Applicant: HARMOTEC CO., LTD., Kofu (JP)

(72) Inventors: Hitoshi Iwasaka, Kofu (JP); Hideyuki Tokunaga, Kofu (JP); Yuji Kasai, Kofu (JP); Katsuhiro Koshiishi, Kofu (JP); Hidemitsu Tanaka, Kofu (JP); Hirohiko Ono, Kofu (JP); Katsutoshi Minoura, Kofu (JP); Naonari Iwasaka, Kofu (JP)

(73) Assignee: HARMOTEC CO., LTD., Kofu (JP)

( * ) Notice: Subject to any disclaimer, the term of this patent is extended or adjusted under 35 U.S.C. 154(b) by 499 days.

(21) Appl. No.: 16/618,545

(22) PCT Filed: Sep. 6, 2018

(86) PCT No.: PCT/JP2018/033086
§ 371 (c)(1),
(2) Date: Dec. 2, 2019

(87) PCT Pub. No.: WO2019/058989
PCT Pub. Date: Mar. 28, 2019

(65) Prior Publication Data
US 2020/0164527 A1  May 28, 2020

(30) Foreign Application Priority Data
Sep. 20, 2017  (JP) .............................. JP2017-180384

(51) Int. Cl.
*B25J 15/06*  (2006.01)
*B25B 11/00*  (2006.01)

(52) U.S. Cl.
CPC ......... *B25J 15/0675* (2013.01); *B25B 11/007* (2013.01); *B25J 15/0683* (2013.01)

(58) Field of Classification Search
CPC ............... H01L 21/6838; B25J 15/0616; B25J 15/0675; B25J 15/0683; B65G 47/911
(Continued)

(56) References Cited

U.S. PATENT DOCUMENTS 4,735,449 A * 4/1988 Kuma ................. H01L 21/6838
294/64.3
5,169,196 A * 12/1992 Safabakhsh ........ H05K 13/0409
271/97
(Continued)

FOREIGN PATENT DOCUMENTS

CN         1765013 A      4/2006
CN       102770200 A     11/2012
(Continued)

OTHER PUBLICATIONS

Oct. 26, 2021 Office Action issued in Japanese Patent Application No. 2017-180384.
(Continued)

*Primary Examiner* — Dean J Kramer
(74) *Attorney, Agent, or Firm* — Oliff PLC

(57) ABSTRACT

A suction device that holds a member by suction in a stable manner is provided. The suction device includes a columnar main body, a flat end face formed on the main body, a concave part formed in the end face, a fluid flow-forming supply paths for forming a fluid swirl flow in the concave part by discharging fluid into the concave part, the fluid swirl flow generating negative pressure that applies suction to a member, and a linear guide groove formed on the end surface along a direction in which the fluid discharged into the concave part flows out of the concave part.

8 Claims, 10 Drawing Sheets

(58) Field of Classification Search
USPC .................................................... 294/64.3
See application file for complete search history.

(56) References Cited

U.S. PATENT DOCUMENTS

| | | | |
|---|---|---|---|
| 7,510,226 B2 | 3/2009 | Akiyama | |
| 7,823,941 B2* | 11/2010 | Caldwell | B66C 1/0262 |
| | | | 294/64.3 |
| 8,904,629 B2* | 12/2014 | Ryu | B65G 47/911 |
| | | | 29/743 |
| 9,308,650 B2 | 4/2016 | Eisele et al. | |
| 2003/0033728 A1 | 2/2003 | Iwasaka et al. | |
| 2006/0290151 A1 | 12/2006 | Akiyama | |
| 2011/0156331 A1 | 6/2011 | Harada et al. | |
| 2012/0307588 A1 | 12/2012 | Hanada et al. | |
| 2015/0298320 A1 | 10/2015 | Eisele et al. | |
| 2016/0300749 A1 | 10/2016 | Iwasaka et al. | |

FOREIGN PATENT DOCUMENTS

| | | | |
|---|---|---|---|
| CN | 104669282 A | 6/2015 | |
| CN | 204800652 U | 11/2015 | |
| JP | S50-118147 A | 9/1975 | |
| JP | 2005-051260 A | 2/2005 | |
| JP | 2005-251948 A | 9/2005 | |
| JP | 2010-016208 A | 1/2010 | |
| JP | 2011-161529 A | 8/2011 | |
| JP | 2013-013992 A | 1/2013 | |
| JP | 2015-103648 A | 6/2015 | |
| JP | 3199452 U | 8/2015 | |
| JP | 5803670 B2 * | 11/2015 | B65G 49/061 |
| KR | 10-2012-0042507 A | 5/2012 | |
| KR | 20130126466 * | 11/2013 | |
| KR | 10-2016-0093674 A | 8/2016 | |
| WO | 2011/105596 A1 | 9/2011 | |

OTHER PUBLICATIONS

Apr. 18, 2008 Office Action issued in Taiwanese Patent Application No. 107132001.
Dec. 11, 2018 International Search Report issued in International Patent Application No. PCT/JP2018/033086.
May 11, 2021 extended Search Report issued in European Patent Application No. 18858330.6.
Feb. 15, 2021 Office Action issued in Japanese Patent Application No. 2017-180384.
Mar. 22, 2021 Office Action issued in Korean Patent Application No. 10-2019-7038165.
Apr. 5, 2022 Office Action issued in Japanese Patent Application No. 2017-180384.
Jun. 6, 2022 Office Action issued in Chinese Patent Application No. 201880041926.1.
Feb. 15, 2023 Office Action issued in European Patent Application No. 18858330.6.
Feb. 7, 2023 Office Action issued in Chinese Patent Application No. 201880041926.1.

* cited by examiner

[FIG. 1]
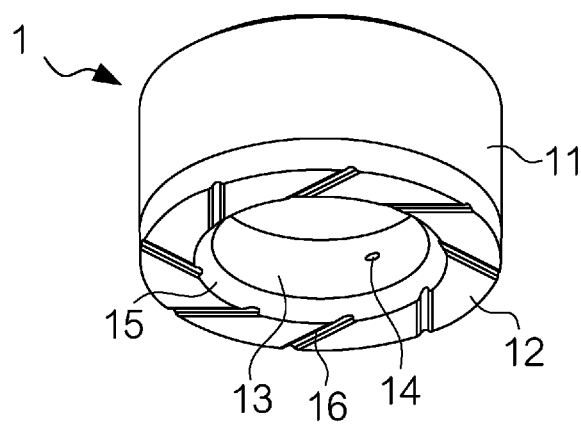
[FIG. 2]
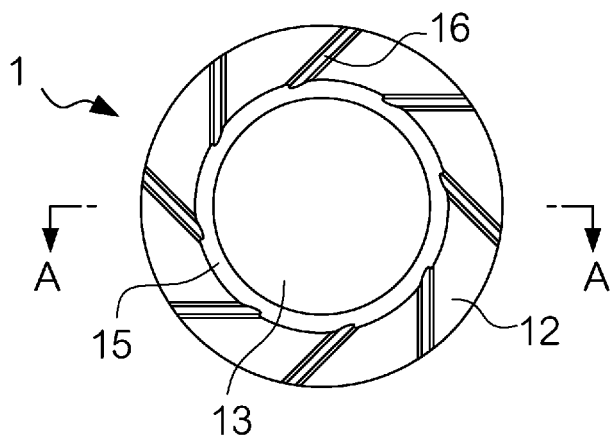
[FIG. 3]
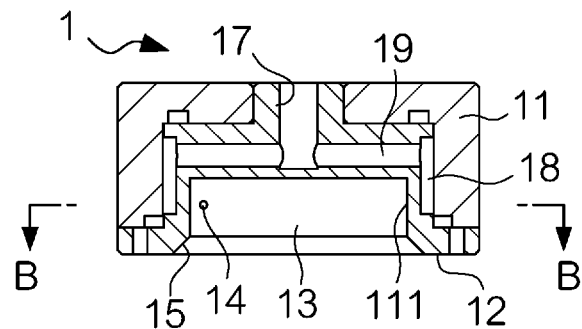

[FIG. 4]
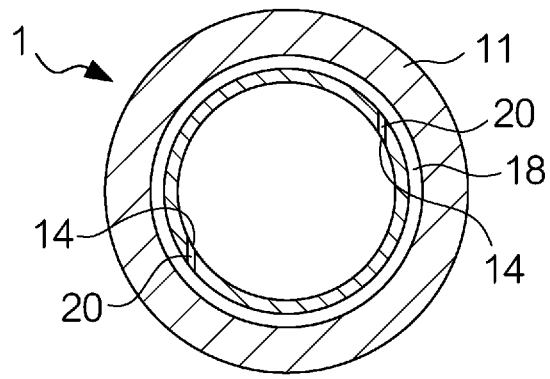
[FIG. 5]
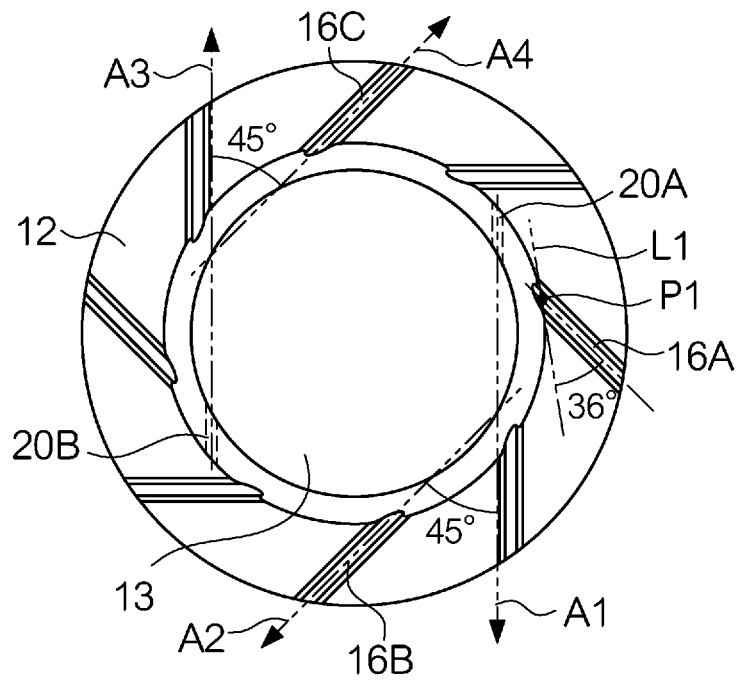
[FIG. 6]
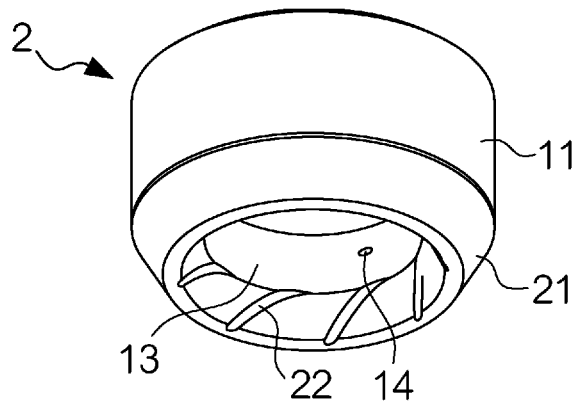

[FIG. 7]
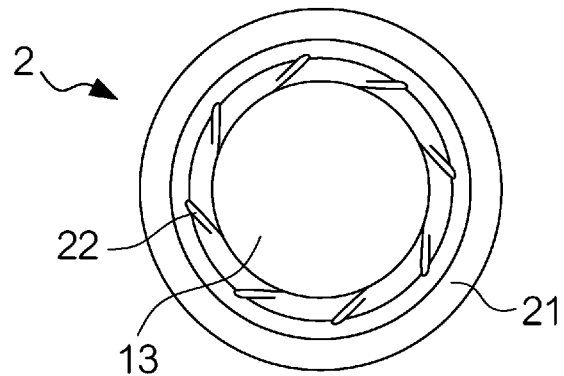
[FIG. 8]
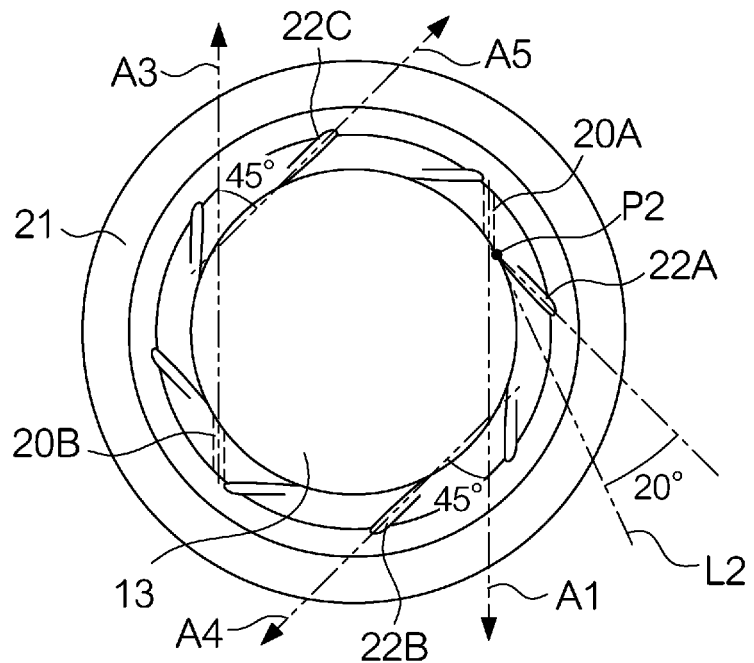
[FIG. 9]
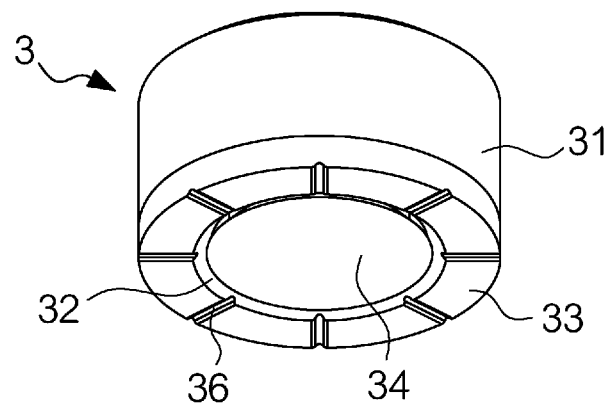

[FIG. 10]
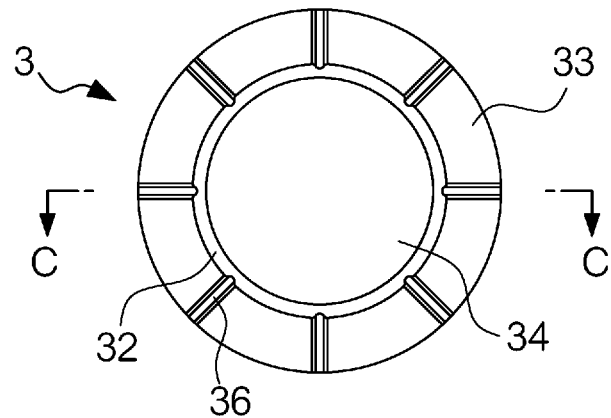
[FIG. 11]
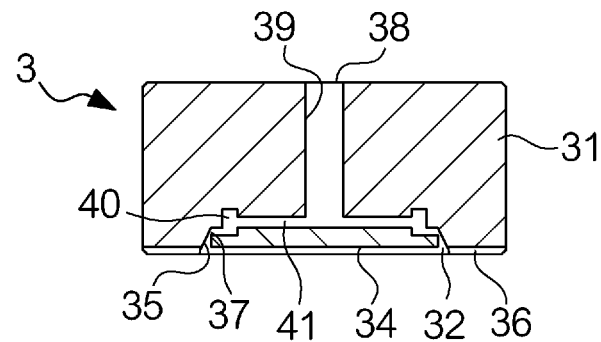
[FIG. 12]
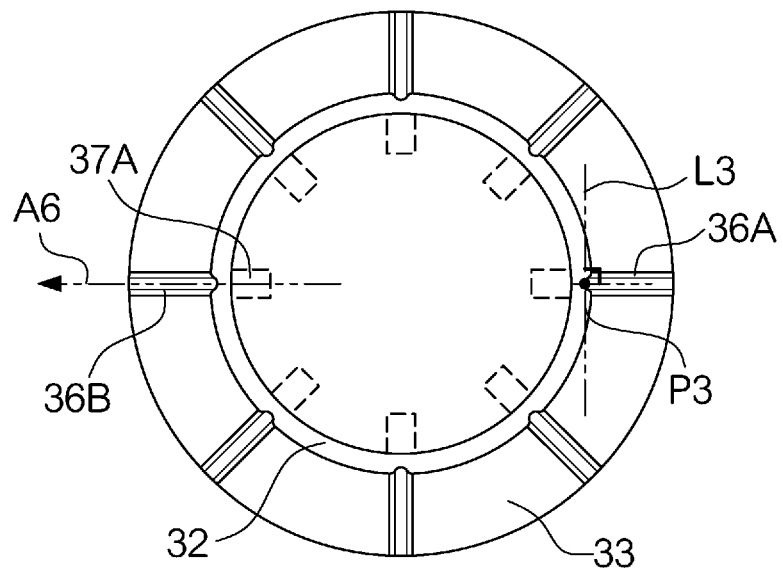

[FIG. 13]
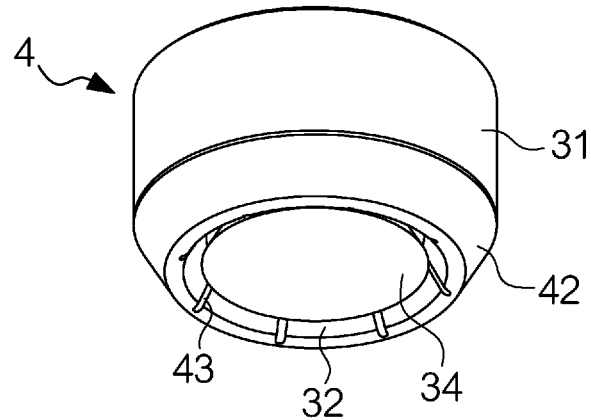
[FIG. 14]
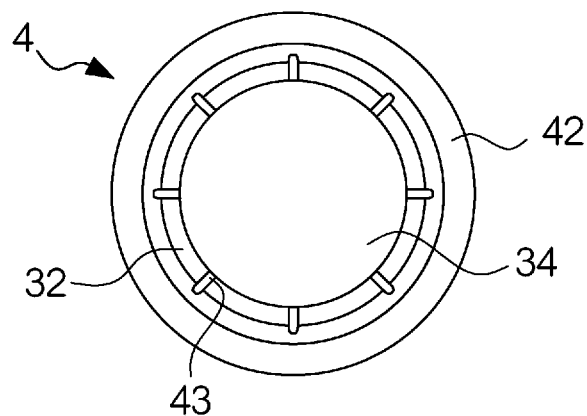
[FIG. 15]
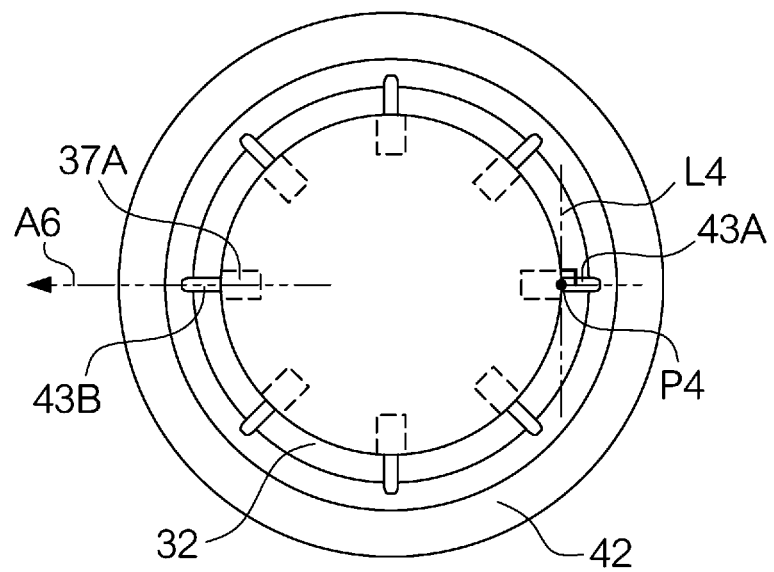

[FIG. 16]
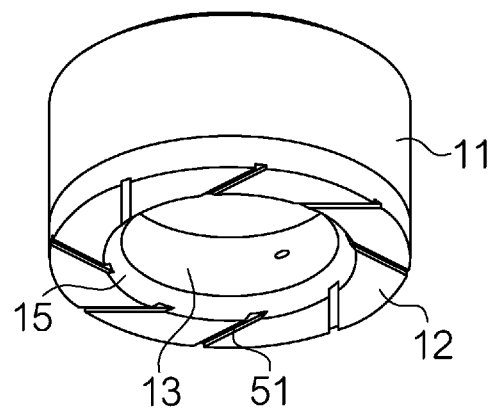
[FIG. 17]
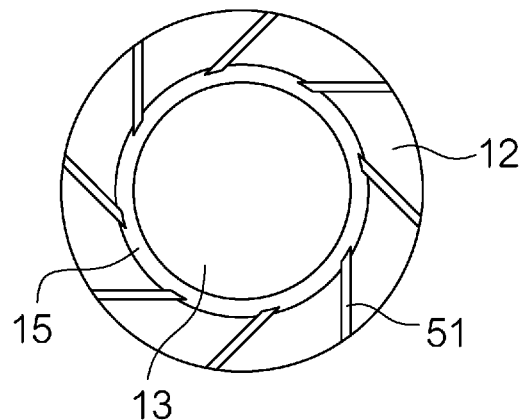
[FIG. 18]
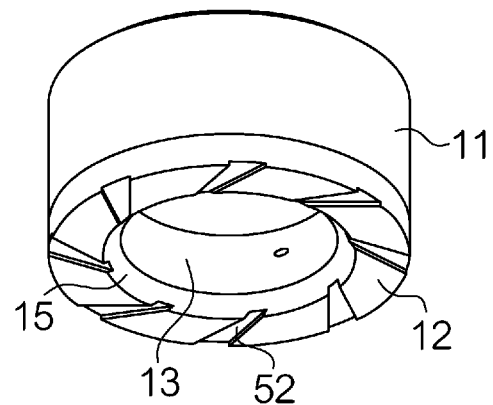

[FIG. 19]
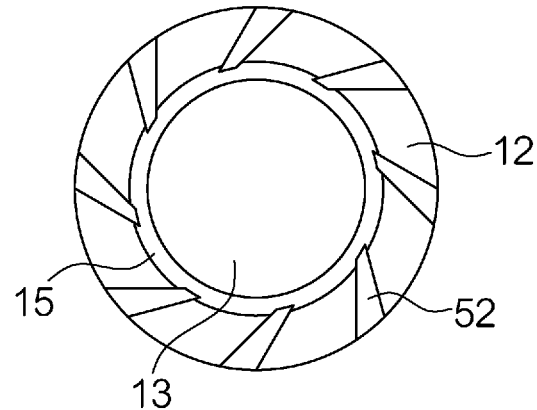
[FIG. 20]
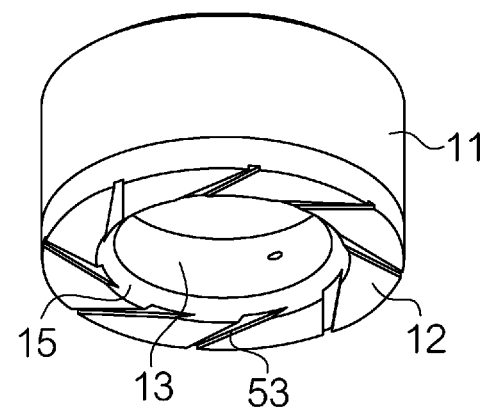
[FIG. 21]
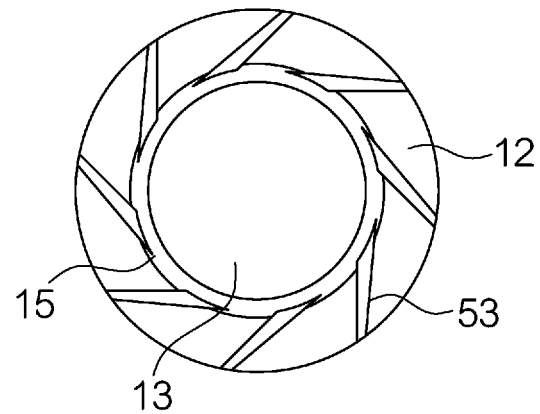

[FIG. 22]
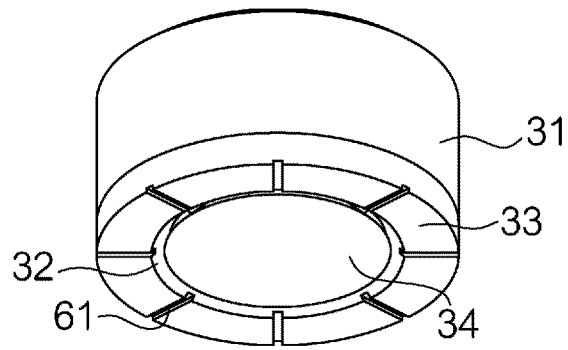
[FIG. 23]
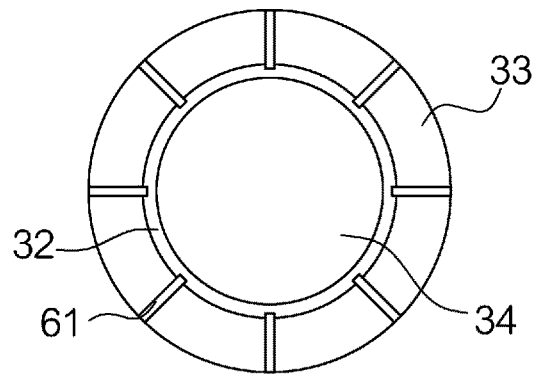
[FIG. 24]
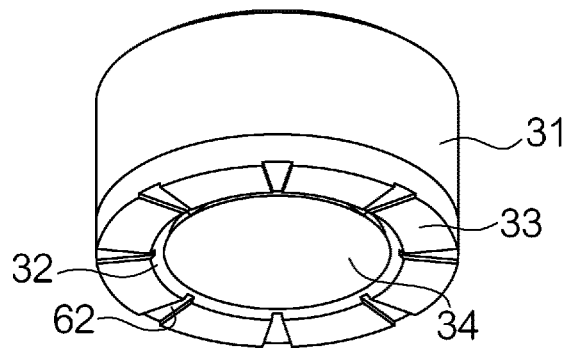
[FIG. 25]
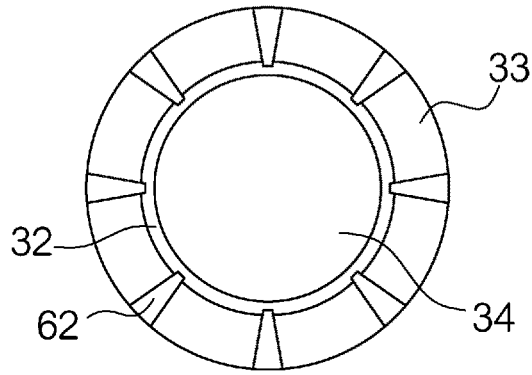

[FIG. 26]
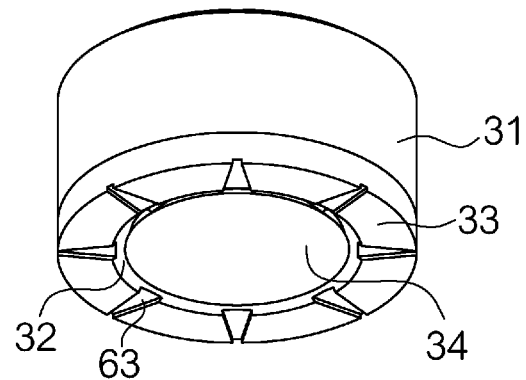
[FIG. 27]
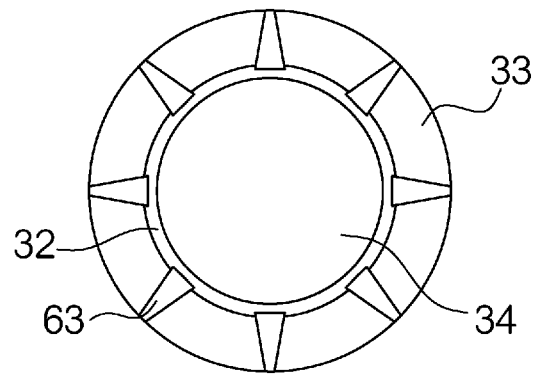
[FIG. 28]
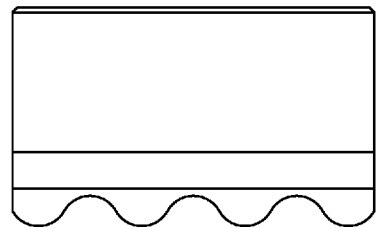
[FIG. 29]
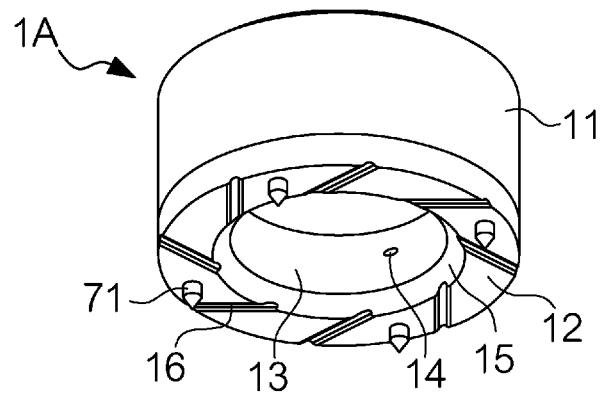

[FIG. 30]
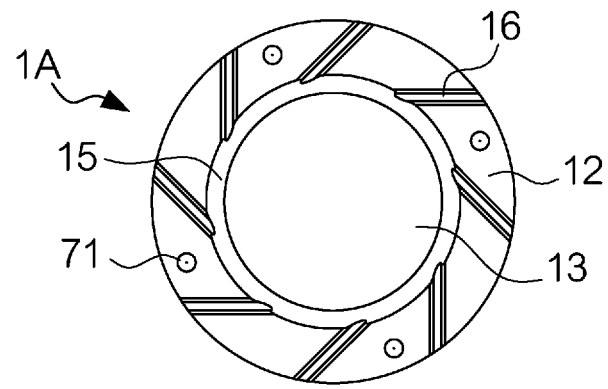
[FIG. 31]
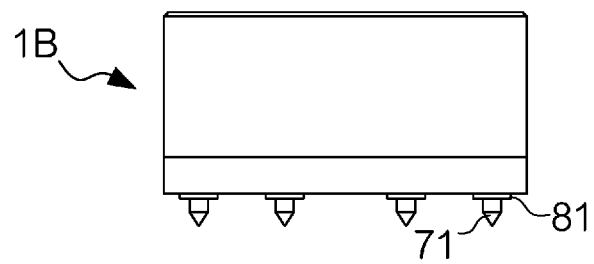
[FIG. 32]
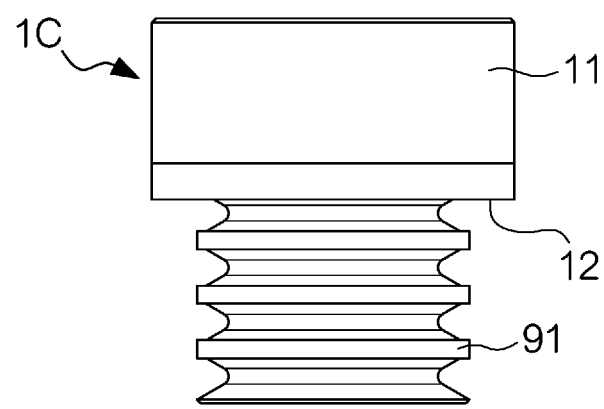

SUCTION DEVICE

TECHNICAL FIELD

The present invention pertains to a device that applies suction to a material under application of Bernoulli's principle.

BACKGROUND ART

Recently, a device has been developed for non-contact conveyance of a plate-like member, such as a semiconductor wafer or a glass substrate. For example, Patent Document 1 discloses a device for non-contact conveyance of a plate-like member under application of Bernoulli's principle. The device includes a cylindrical chamber that opens to an underside. Fluid is supplied into the chamber to generate a swirl flow having a central negative pressure, which exerts suction on the plate-like member. Fluid flowing out of the cylindrical chamber causes a set distance to be maintained between the device and the plate-like member, thereby enabling non-contact conveyance of the plate-like member by the device

PRIOR ART DOCUMENT

Patent Document

Patent Document 1: JP 2005-51260 A1

SUMMARY OF THE INVENTION

Problems to be Solved by the Invention

The present invention has been made in view of this technology, and has as its object the provision of a suction device that is able to hold a member under suction in a highly stable manner.

Means for Solving the Problems

To solve the problem described above, a suction device according to the present invention comprises: a cylindrical main body; an end face formed on the main body; a concave part formed in the end face; a fluid flow-forming means for forming a fluid swirl flow in the concave part or forming a radial flow by discharging fluid into the concave part, the fluid swirl flow or the radial flow generating negative pressure that applies suction to a member; and a linear guide groove formed on the end face along a direction in which the fluid discharged into the concave part flows out of the concave part.

The fluid flow-forming means may be a fluid passage through which the fluid is discharged into the concave part to cause the fluid swirl flow to be formed, and the guide groove may be formed on the end face, when viewed towards the end face, along a direction that forms an angle of approximately 45 degrees with respect to a direction in which the fluid passage extends.

The fluid flow-forming means may be a fluid passage through which the fluid is discharged into the concave part to cause the radial flow to be formed, and the guide groove may be formed on the end face, when viewed towards the end face, along a direction substantially parallel to a direction in which the fluid passage extends.

The guide groove may be formed such that a cross-sectional area of the guide groove increases in proportion to a distance from the concave part.

The guide groove may be formed such that a cross-sectional area of the guide groove decreases in proportion to a distance from the concave part.

The suction device may further comprise a movement restriction means provided on the end face, for restricting movement along the end face of the member to which suction is applied by the negative pressure.

The movement restriction means may be a horn-shaped protrusion that restricts movement of the member by piercing the member.

Another suction device according to the present invention comprises: a columnar main body; an end face formed on the main body; a concave part formed in the end face; a fluid flow-forming means for forming a fluid swirl flow in the concave part or forming a radial flow by discharging fluid into the concave part, the fluid swirl flow or the radial flow generating negative pressure that applies suction to a member; and a linear guide groove formed on the end face along a direction in which the fluid discharged into the concave part flows out of the concave part, the guide groove having a smaller curvature than an arc of an opening edge of the concave part when viewed towards the end face.

Another suction device according to the present invention comprises: a columnar main body; a concave part formed in a surface of the main body; a fluid flow-forming means for forming a fluid swirl flow in the concave part or forming a radial flow by discharging fluid into the concave part, the fluid swirl flow or the radial flow generating negative pressure that applies suction to a member; an annular wall, provided so as to surround the concave part, that prevents the member from entering the concave part; and a linear guide groove formed on an inner wall surface of the annular wall along a direction in which the fluid discharged into the concave part flows out of the concave part.

Another suction device according to the present invention comprises: a columnar main body; a concave part formed in a surface of the main body; a fluid flow-forming means for forming a fluid swirl flow in the concave part or forming a radial flow by discharging fluid into the concave part, the fluid swirl flow or the radial flow generating negative pressure that applies suction to a member; an annular wall, provided so as to surround the concave part, that prevents the member from entering the concave part; and a linear guide groove formed on an inner wall surface of the annular wall along a direction in which the fluid discharged into the concave part flows out of the concave part, the guide groove having a smaller curvature than an arc of an opening edge of the concave part when viewed towards the opening edge of the concave part.

EFFECTS OF THE INVENTION

The suction device according to the present invention is able to more stably hold a member under suction than a suction device that does not include a guide groove.

FIG. 1 is a perspective view of an example of swirl flow-forming body 1.

FIG. 2 is a bottom view of an example of swirl flow-forming body 1.

FIG. 3 is a cross-sectional view of swirl flow-forming body 1 along line A-A shown in FIG. 2.

FIG. 4 is a cross-sectional view of swirl flow-forming body 1 along line B-B shown in FIG. 3.

FIG. 5 is a diagram showing an example of arrangement of guide grooves 16.

FIG. 6 is a perspective view of an example of swirl flow-forming body 2.

FIG. 7 is a bottom view of an example of swirl flow-forming body 2.

FIG. 8 is a diagram showing an example arrangement of guide grooves 22.

FIG. 9 is a perspective view of an example of radial flow-forming body 3.

FIG. 10 is a bottom view of an example of radial flow-forming body 3.

FIG. 11 is a cross-sectional view of radial flow-forming body 3 along line C-C shown in FIG. 10.

FIG. 12 is a diagram showing an example arrangement of guide grooves 36.

FIG. 13 is a perspective view of an example of radial flow-forming body 4.

FIG. 14 is a bottom view of an example of radial flow-forming body 4.

FIG. 15 is a diagram showing an example arrangement of guide grooves 43.

FIG. 16 is a perspective view of a modification of guide grooves 16.

FIG. 17 is a bottom view of a modification of guide grooves 16.

FIG. 18 is a perspective view of a modification of guide grooves 16.

FIG. 19 is a bottom view of a modification of guide grooves 16.

FIG. 20 is a perspective view of a modification of guide grooves 16.

FIG. 21 is a bottom view of a modification of guide grooves 16.

FIG. 22 is a perspective view of a modification of guide grooves 36.

FIG. 23 is a bottom view of a modification of guide grooves 36.

FIG. 24 is a perspective view of a modification of guide grooves 36.

FIG. 25 is a bottom view of a modification of guide grooves 36.

FIG. 26 is a perspective view of a modification of guide grooves 36.

FIG. 27 is a bottom view of a modification of guide grooves 36.

FIG. 28 is a side view of a modification of guide grooves.

FIG. 29 is a perspective view of an example of swirl flow-forming body 1A.

FIG. 30 is a bottom view of an example of swirl flow-forming body 1A.

FIG. 31 is a side view of an example of swirl flow-forming body 1B.

FIG. 32 is a side view of an example of swirl flow-forming body 1C.

MODES FOR IMPLEMENTING THE INVENTION

Embodiments of the present invention are described below with reference to the figures.

1. First Embodiment

FIG. 1 shows a perspective view of an example of swirl flow-forming body 1, which is an example of a "suction device" according to the present invention. FIG. 2 shows a bottom view of an example of swirl flow-forming body 1. FIG. 3 shows a cross-sectional view of swirl flow-forming body 1 along line A-A shown in FIG. 2. FIG. 4 shows a cross-sectional view of swirl flow-forming body 1 along line B-B shown in FIG. 3. Swirl flow-forming body 1 shown in these drawings is a device for forming a swirl flow, formation of which causes suction to be applied to a member under application of Bernoulli's principle. The member to which suction is applied by swirl flow-forming body 1 may be, for example, a food such as a croquette or a Japanese deep-fried dish. Swirl flow-forming body 1 may be attached to an end of a robot arm, for example.

Swirl flow-forming body 1 includes main body 11, end face 12, concave part 13, two jetting ports 14, inclined surface 15, and eight guide grooves 16. Main body 11 is made from an aluminum alloy and is cylindrical in shape. End face 12 is formed in a flat shape on a surface of main body 11, which is to face a member to be conveyed. Hereafter, the surface of main body 11 is simply referred to as a "bottom surface." Concave part 13 is a column-shaped bottomed hole and is formed on end face 13. Concave part 13 is formed on the same axis as main body 11. Two jetting ports 14 are formed on inner-peripheral side surface 111 of main body 11 facing concave part 13. Jetting ports 14 are arranged nearer end face 12 in relation to the center in the axial direction of inner-peripheral side surface 111. Jetting ports 14 are arranged in mutually opposing relation to each other. Specifically, jetting ports 14 are arranged in point symmetry about the axial center of the central axis of main body 11 or concave part 13. Jetting ports 14 allow fluid supplied to swirl flow-forming body 1 to be discharged into concave part 13. The fluid discharged into concave part 13 may be, for example, a gas such as compressed air, or a liquid such as pure water or carbonated water. Inclined surface 15 is formed at the opening end of main body 11.

Eight guide grooves 16 are formed in a straight line from the inner peripheral edge to the outer peripheral edge of end face 12 along a direction in which fluid discharged into concave part 13 flows out of concave part 13. The direction in which the fluid flows out of concave part 13 refers to, specifically, a direction of a vector obtained by combining vectors of fluid molecules that are discharged from jetting port 14 and flow out of concave part 13. More specifically, guide groove 16 is formed, when viewed towards end face 12, along a direction that forms an angle of approximately 36 degrees with respect to a tangent line that passes through the contact point between the guide groove 16 and the opening edge of concave part 13. For example, on the exemplary bottom shown in FIG. 5, a direction of guide groove 16A forms an angle of 36 degrees with respect to tangent line L1 that passes through contact point P1 between the guide groove 16A and the opening edge of concave part 13. Among eight guide grooves 16, a direction of two guide grooves 16, when viewed towards end face 12, forms an angle of approximately 45 degrees with respect to a direction in which supply path 20 (described later) extends. The other six guide grooves 16 are formed such that adjacent guide grooves 16 extend in directions that form an angle of approximately 45 degrees. For example, on the exemplary bottom shown in FIG. 5, a direction of guide groove 16B (arrow A2) forms an angle of 45 degrees with respect to a direction (arrow A1) in which supply path 20A extends. A direction of guide groove 16C (arrow A4) forms an angle of 45 degrees with respect to a direction (arrow A3) in which supply path 20B extends. Each of the guide grooves 16 has a semicircular cross-sectional shape.

The guide grooves 16 configured as described in the foregoing align and guide most of the fluid molecules flowing out from the opening of concave part 13, in a direction away from concave part 13. A collision rate of the fluid molecules guided by the guide grooves 16 with the member conveyed is lower than that of fluid molecules flowing along end face 12.

Swirl flow-forming body 1 also includes supply port 17, annular passage 18, communication passage 19, and two supply paths 20, which is an example of "fluid flow-forming means" according to the present invention. Supply port 17 has a disk shape and is provided in the center of the top surface (that is, the surface opposite the bottom surface) of main body 11. Supply port 17 is connected to a fluid supply pump (not illustrated) via a tube, for example. Fluid is supplied into main body 11 via supply port 17. Annular passage 18 has a cylindrical shape and is formed inside main body 11 so as to surround concave part 13. Annular passage 18 is formed on the same axis as concave part 13. Annular passage 18 supplies supply path 20 with fluid supplied from communication passage 19. Communication passage 19 is provided inside main body 11 and extends in a straight line in a radial direction of the bottom surface or top surface of main body 11. Both ends of communication passage 19 are in communication with annular passage 18. Communication passage 19 supplies annular passage 18 with fluid that is supplied into main body 11 via supply port 17. Two supply paths 20 are formed approximately parallel to end face 12, and extend in a direction tangential to the outer periphery of concave part 13, and are parallel to each other. Each of supply paths 20 communicates with annular passage 18 at one end, and communicates with jetting port 14 at the other end thereof. Each of supply paths 20 forms a fluid swirl flow within concave part 13.

A suction operation of swirl flow-forming body 1 is described below. When swirl flow-forming body 1 is supplied with fluid from the fluid supply pump via supply port 17, the fluid passes through each of communication passage 19, annular passage 18, and supply paths 20 for discharge from jetting ports 14 into concave part 13. Upon discharge of the fluid a swirl flow is created within concave part 13, and the fluid subsequently flows out of the opening of concave part 13. If a member to be conveyed is present in a position opposing the opening of concave part 13, inflow of external fluid to concave part 13 is restricted, and a density of fluid molecules per unit volume in the center of the swirl flow is reduced under the action of centrifugal force and an entrainment effect of the swirl flow; in other words, a negative pressure is generated within concave part 13. As a result, fluid that surrounds swirl flow-forming body 1 is caused to flow into concave part 13, so that pressure is applied to the member by the surrounding fluid to be gravitated towards swirl flow-forming body 1. On the other hand, most fluid molecules flowing out of the opening of concave part 13 are aligned and discharged out of swirl flow-forming body 1 by guide grooves 16.

According to swirl flow-forming body 1, most fluid molecules flowing out of concave part 13 are aligned and discharged by guide grooves 16, so that the fluid molecules are prevented from colliding with the member. As a result, undulation and rotation of the member is controlled, and noise caused by collision between the fluid molecules and the member is reduced. Swirl flow-forming body 1 has fewer parts than a conventional suction device in which spacers inserted between a swirl flow-forming body and a baffle plate form flow paths of outflow fluid (for example, refer to published unexamined patent application No. 2016-159405), so that swirl flow-forming body 1 can be manufactured at a lower cost. It is easier to clean flow paths of swirl flow-forming body 1 than to clean those of a conventional suction device in which the baffle plate covers the flow paths.

According to swirl flow-forming body 1, all fluid to which suction is applied by swirl flow-forming body 1 is discharged out of swirl flow-forming body 1, and does not enter concave part 13 or jetting port 14, whereby the supply path of fluid is prevented from being contaminated by the member.

2. Second Embodiment

Swirl flow-forming body 2 according to a second embodiment, which is an example of a "suction device" according to the present invention, differs from swirl flow-forming body 1 according to the first embodiment in that swirl flow-forming body 2 includes annular wall 21 on which eight guide grooves 22 are formed, instead of end face 12 and inclined surface 15. Below, this difference is described.

FIG. 6 shows a perspective view of an example of swirl flow-forming body 2. FIG. 7 shows a bottom view of an example of swirl flow-forming body 2. Annular wall 21 shown in these drawings has a trapezoidal cross-sectional shape. Annular wall 21 is formed such that: the outer diameter of one end face is equal to the diameter of main body 11 and the inner diameter of the one end face is equal to the diameter of concave part 13; and the outer diameter of the other end face is smaller than the outer diameter of the one end face, and the inner diameter of the other end face is larger than the inner diameter of the one end face. In other words, annular wall 21 is formed such that a thickness (or an opening area) of annular wall 21 gradually decreases from one end to the other end. The one end face of annular wall 21 is fixed to main body 11 on the same axis as main body 11 so as to surround concave part 13.

Annular wall 21 configured as described in the foregoing comes into contact with a member to which suction is applied by negative pressure generated in concave part 13, so that the member is prevented from entering concave part 13. Annular wall 21 also prevents the member, a part of which has entered the opening of annual wall 21, from moving in a radial direction.

Eight guide grooves 22 are formed in a straight line from the one end to the other end of annular wall 21 along a direction in which fluid discharged into concave part 13 flows out of concave part 13. The direction in which the fluid flows out of concave part 13 refers to, specifically, a direction of a vector obtained by combining vectors of fluid molecules that are discharged from jetting port 14 and flow out of concave part 13. More specifically, guide groove 22 is formed, when viewed towards the other end of annular wall 21, along a direction that forms an angle of approximately 20 degrees with respect to a tangent line that passes through the contact point between the guide groove 22 and the opening edge of concave part 13. For example, on the exemplary bottom shown in FIG. 8, a direction of guide groove 22A forms an angle of 20 degrees with respect to tangent line L2 that passes through contact point P2 between the guide groove 22A and the opening edge of concave part 13. Among eight guide grooves 22, a direction of two guide grooves 22, when viewed towards the other end of annular wall 21, forms an angle of approximately 45 degrees with respect to a direction in which supply path 20 extends. The other six guide grooves 22 are formed such that directions of adjacent guide grooves 22 form an angle of approximately 45 degrees. For example, on the exemplary bottom shown in FIG. 8, a direction of guide groove 22B (arrow A4) forms an angle of 45 degrees with respect to a direction (arrow A1) in which supply path 20A extends. A direction of guide groove 22C (arrow A5) forms an angle of 45 degrees with respect to a direction (arrow A3) in which supply path 20B extends. Each of the guide grooves 22 has a semicircular cross-sectional shape.

The guide grooves 22 configured as described in the foregoing align and guide most of the fluid molecules flowing out from the opening of concave part 13, in a direction away from concave part 13. A collision rate of the fluid molecules guided by the guide grooves 22 with the member conveyed is lower than that of fluid molecules flowing along the inner wall surface of annular wall 21.

According to swirl flow-forming body 2, during a suction operation, most of the fluid molecules flowing out of concave part 13 are aligned and discharged out of swirl flow-forming body 2 by guide grooves 22. Accordingly, swirl flow-forming body 2 has the same effect as swirl flow-forming body 1 according to the first embodiment.

3. Third Embodiment

Radial flow-forming body 3 according to a third embodiment, which is an example of a "suction device" according to the present invention, differs from swirl flow-forming body 1 according to the first embodiment in that radial flow-forming body 3 forms a radial flow that applies suction to a member by use of Bernoulli's principle. Below, the difference is described.

FIG. 9 shows a perspective view of an example of radial flow-forming body 3. FIG. 10 is a bottom view of an example of radial flow-forming body 3. FIG. 11 shows a cross-sectional view of radial flow-forming body 3 along line C-C shown in FIG. 10. Radial flow-forming body 3 shown in these drawings includes main body 31, annular concave part 32, end face 33, opposing surface 34, inclined surface 35, and eight guide grooves 36. Main body 31 is made from an aluminum alloy and is cylindrical. End face 33 is formed in a flat shape on a surface of main body 31 that deals with a member to be conveyed. The surface of main body 31 is hereafter referred to as "bottom surface." Annular concave part 32 is formed on end face 33 concentrically with the outer periphery of main body 31. Opposing surface 34 formed on the bottom surface of main body 31 is flat, whereby opposing surface 34 is recessed relative to end face 33. Opposing surface 34 is surrounded by annular concave part 32 and faces a member to be conveyed. Inclined surface 35 is formed on the opening end of annular concave part 32.

Eight guide grooves 36 are formed in a straight line from the inner peripheral edge to the outer peripheral edge of end face 33 along a direction in which fluid discharged into annular concave part 32 flows out of annular concave part 32. The direction in which the fluid flows out of annular concave part 32 refers to, specifically, a direction of a vector obtained by combining vectors of fluid molecules that are discharged from nozzle passage 37 (described later) and flow out of annular concave part 32. More specifically, a direction of guide groove 36, when viewed towards end face 33, forms an angle of approximately 90 degrees with respect to a tangent line that passes through the contact point between the guide groove 36 and the opening edge of annular concave part 32. For example, on the exemplary bottom shown in FIG. 12, a direction of guide groove 36A forms an angle of 90 degrees with respect to tangent line L3 that passes through contact point P3 between the guide groove 36A and the opening edge of annular concave part 32. A direction of guide groove 36, when viewed towards end face 33, is substantially parallel to a direction in which nozzle passage 37 extends (more specifically, in a straight line). For example, on the exemplary bottom shown in FIG. 12, guide groove 36B is formed along a direction (arrow A6) in which nozzle passage 37A extends.

The guide grooves 36 configured as described in the foregoing align and guide most of the fluid molecules flowing out from the opening of annular concave part 32, in a direction away from annular concave part 32. A collision rate of the fluid molecules guided by the guide grooves 36 with the member conveyed is lower than that of fluid molecules flowing along end face 33.

Radial flow-forming body 3 also includes eight nozzle passages 37, which are examples of a "fluid flow-forming means" according to the present invention, introduction port 38, introduction path 39, annular passage 40, and communication passage 41. Introduction port 38 has a circular shape and is provided in the center of the top surface (that is, the surface opposite the bottom surface) of main body 31. Introduction port 38 is connected to a fluid supply pump (not illustrated), via a tube, for example. Introduction path 39 is provided inside main body 31, and extends in a straight line along the central axis of main body 31. Introduction path 39 communicates with introduction port 38 at one end, and communicates with communication passage 41 at the other end thereof. Introduction path 39 supplies communication passage 41 with fluid supplied into main body 31 via introduction port 38.

Communication passage 41 is provided inside main body 31, and extends in a straight line in the radial direction of annular passage 40. Communication passage 41 communicates with introduction path 39 at the central part thereof in the axial direction, and communicates with annular passage 40 at both ends thereof. Communication passage 41 supplies annular passage 40 with fluid supplied from introduction path 39. Annular passage 40 has a cylindrical shape and is provided inside main body 31. Annular passage 40 is formed on the same axis as main body 31. Annular passage 40 supplies nozzle passages 37 with fluid supplied from communication passage 41.

Each of the eight nozzle passages 37 is formed so as to be approximately parallel to end face 33 or opposing surface 34 and to extend in a straight line in the radial direction of the bottom surface or top surface of main body 31, one end thereof communicating with annular passage 40 and the other end communicating with annular concave part 32. The nozzle passages 37 are arranged on the same plane such that adjacent two nozzle passages 37 form an angle of approximately 45 degrees. Each of the nozzle passages 37 discharges fluid into annular concave part 32 to form a radial flow.

A suction operation of radial flow-forming body 3 is described below. When radial flow-forming body 3 is supplied with fluid via introduction port 38, the fluid passes through introduction path 39, communication passage 41, and annular passage 40 to be discharged from nozzle passages 37 into annular concave part 32. The fluid discharged into annular concave part 32 flows out of the opening of annular concave part 32 as a radial flow. At this time, if a member to be conveyed is present in a position opposing the opening of annular concave part 32, inflow of external fluid to the space between radial flow-forming body 3 and the member is limited, and the density of fluid molecules per unit volume in the space becomes reduced due to an entrainment effect of the radial flow; in other words, negative pressure is generated. As a result, pressure is applied to the member by the surrounding fluid to be gravitated towards radial flow-forming body 3. On the other hand, most of the fluid molecules flowing out of the opening of annular concave part 32 are aligned and discharged out of radial flow-forming body 3 by guide grooves 36.

According to radial flow-forming body 3, most of the fluid molecules flowing out of annular concave part 32 are aligned and discharged by guide grooves 36, so that the fluid molecules are prevented from colliding with the member. As a result, undulation and rotation of the member is controlled, and a noise caused by collision between the fluid molecules and the member is reduced. Radial flow-forming body 3 has fewer parts than the above-described conventional suction device; therefore, radial flow-forming body 3 can be manufactured at a lower cost. It is easier to clean flow paths of radial flow-forming body 3 than to clean those of a conventional suction device in which the baffle plate covers the flow paths.

According to radial flow-forming body 3, all fluid to which suction is applied by radial flow-forming body 3 is discharged out of radial flow-forming body 3, and does not enter annular concave part 32 or nozzle passage 37, whereby the supply path of fluid is prevented from being contaminated by the member.

4. Fourth Embodiment

Radial flow-forming body 4 according to a fourth embodiment, which is an example of a "suction device" according to the present invention, differs from radial flow-forming body 3 according to the third embodiment in that radial flow-forming body 4 includes annular wall 42 on which eight guide grooves 43 are formed, instead of end face 33. Below, the difference is described.

FIG. 13 shows a perspective view of an example of radial flow-forming body 4. FIG. 14 shows a bottom view of an example of radial flow-forming body 4. Annular wall 42 shown in these drawings has a trapezoidal cross-sectional shape. Annular wall 42 is formed such that: the outer diameter of one end face is equal to the diameter of main body 31 and the inner diameter of the one end face is equal to the outer diameter of annular concave part 32; and the outer diameter of the other end face is smaller than the outer diameter of the one end face, and the inner diameter of the other end face is larger than the inner diameter of the one end face. In other words, annular wall 42 is formed such that a thickness (or an opening area) of annular wall 42 gradually decreases from one end to the other end. The one end face of annular wall 42 is fixed to main body 31 on the same axis as main body 31 so as to surround annular concave part 32.

Annular wall 42 configured as described in the foregoing comes into contact with a member to which suction is applied by negative pressure generated by main body 31, so that the member is prevented from entering annular concave part 32. Annular wall 42 also prevents the member, a part of which has entered the opening of annual wall 42, from moving in a radial direction.

Eight guide grooves 43 are formed in a straight line from the one end to the other end of annular wall 42 along a direction in which fluid discharged into annular concave part 32 flows out of annular concave part 32. The direction in which the fluid flows out of annular concave part 32 refers to, specifically, a direction of a vector obtained by combining vectors of fluid molecules that are discharged from nozzle passage 37 and flow out of annular concave part 32. More specifically, a direction of guide groove 43, when viewed towards the other end of annular wall 42, forms an angle of approximately 90 degrees with respect to a tangent line that passes through the contact point between the guide groove 43 and the opening edge of annular concave part 32. For example, on the exemplary bottom shown in FIG. 15, a direction of guide groove 43A forms an angle of 90 degrees with respect to tangent line L4 that passes through contact point P4 between the guide groove 43A and the opening edge of annular concave part 32. A direction of guide groove 43, when viewed towards the other end of annular wall 42, is substantially parallel to a direction in which nozzle passage 37 extends (more specifically, a straight line). For example, on the exemplary bottom shown in FIG. 15, guide groove 43B is formed along a direction (arrow A6) in which nozzle passage 37A extends.

The guide grooves 43 configured as described in the foregoing align and guide most of the fluid molecules flowing out from the opening of annular concave part 32, in a direction away from annular concave part 32. A collision rate of the fluid molecules guided by the guide grooves 43 with the member conveyed is lower than that of fluid molecules flowing along the inner wall surface of annular wall 43.

According to radial flow-forming body 4, during a suction operation, most of the fluid molecules flowing out of annular concave part 32 are aligned and discharged out of radial flow-forming body 4 by guide grooves 43. Accordingly, radial flow-forming body 4 has the same effect as radial flow-forming body 3 according to the third embodiment.

5. Modifications

The embodiments described above may be modified as described below. It is of note that the following modifications may be combined.

5-1. Modification 1

The shape of main body 11 and concave part 13 of swirl flow-forming body 1 according to the first embodiment is not limited to a cylindrical shape, and may be a square or elliptical columnar shape. Inner-peripheral side surface 111 of main body 11 that faces concave part 13 may be tapered such that the diameter of concave part 13 enlarges toward the opening. Swirl flow-forming body 1 may be provided with a convex part that is formed within concave part 13 such that a fluid flow path is formed between the outer-peripheral side surface of the convex part and inner-peripheral side surface 111 of main body 11 (for example, refer to FIG. 13 of published unexamined patent application number 2016-159405). The number of jetting ports 14 and supply paths 20 provided in swirl flow-forming body 1 is not limited to two, and may be fewer or may be more. Jetting ports 14 may be arranged in any of an upper side, at the center, or in a lower side in the axial direction of inner-peripheral side surface 111. The formation of inclined surface 15 may be omitted. The shape of supply port 17 is not limited to being circular, and may be rectangular or elliptical. Supply port 17 may be formed on the side surface of main body 11, instead of on the top surface. Supply paths 20 do not necessarily have to be parallel to each other.

In swirl flow-forming body 1 according to the first embodiment, an electric fan for forming a swirl flow that applies suction to a member by use of Bernoulli's principle may be adopted, instead of the fluid passages formed inside main body 11 (for example, refer to published unexamined patent application number 2011-138948). The electric fan is an example of a "fluid flow-forming body" according to the present invention.

The shape of main body 31 of radial flow-forming body 3 according to the third embodiment is not limited to being cylindrical, and may be a square or elliptical columnar shape. The number of nozzle passages 37 provided in radial flow-forming body 3 is not limited to eight, and may be fewer or may be more. The shape of introduction port 38 is not limited to being circular, and may be rectangular or elliptical. Introduction port 38 may be formed on the side surface of main body 31, instead of on the top surface.

The cross-sectional shapes of annular walls 21 according to the second embodiment and annular wall 42 according to the fourth embodiment are not limited to being trapezoid, but may be a semicircular or triangular shape. Annular wall 21 and main body 11 may be integrally formed, and annular wall 42 and main body 31 may be integrally formed.

5-2. Modification 2

FIGS. 16 to 21 are diagrams showing modifications of guide grooves 16 according to the first embodiment. FIGS. 16 and 17 show guide grooves 51 that differ from guide grooves 16 in that the cross-sectional shape of guide grooves 51 is rectangular. It is of note that the cross-sectional shape of guide grooves 51 may be a V shape or a semi-elliptical shape. FIGS. 18 and 19 show guide grooves 52 that differ from guide grooves 16 in that the cross-sectional shape of guide grooves 52 is rectangular, and that the cross-sectional area of guide grooves 52 increases in proportion to the distance from concave part 13. It is of note that guide grooves 52 may have a width that increases in proportion to the distance from concave part 13, and/or a depth that increases in proportion to the distance from concave part 13. FIGS. 20 and 21 show guide grooves 53 that differ from guide grooves 16 in that the cross-sectional shape of guide grooves 53 is rectangular, and that the cross-sectional area of guide grooves 53 decreases in proportion to the distance from concave part 13. It is of note that guide grooves 53 may have a width that decreases in proportion to the distance from concave part 13, and/or a depth that decreases in proportion to the distance from concave part 13.

It is of note that each of the modifications to guide grooves 16 may be applied to guide grooves 22 according to the second embodiment.

FIGS. 22 to 27 are diagrams showing modifications of guide grooves 36 according to the third embodiment. FIGS. 22 and 23 show guide grooves 61 that differ from guide grooves 36 in that the cross-sectional shape of guide grooves 61 is rectangular. It is of note that the cross-sectional shape of guide grooves 61 may be a V shape or a semi-elliptical shape. FIGS. 24 and 25 show guide grooves 62 that differ from guide grooves 36 in that the cross-sectional shape of guide grooves 62 is rectangular, and that the cross-sectional area of guide grooves 62 increases in proportion to the distance from annular concave part 32. It is of note that guide grooves 62 may have a width that increases in proportion to the distance from annular concave part 32, and/or a depth that increases in proportion to the distance from annular concave part 32. FIGS. 26 and 27 show guide grooves 63 that differ from guide grooves 36 in that the cross-sectional shape of guide grooves 63 is rectangular, and that the cross-sectional area of guide grooves 63 decreases in proportion to the distance from annular concave part 32. It is of note that guide grooves 63 may have a width that decreases in proportion to the distance from annular concave part 32, and/or a depth that decreases in proportion to the distance from annular concave part 32.

It is of note that each of the modifications to guide grooves 36 may be applied to guide grooves 43 according to the fourth embodiment.

The number of guide grooves according to each of the above embodiments is not limited to eight, and may be fewer or may be more. A width and a depth of each of the guide grooves may be larger than is shown in the illustrated example. For example, end face 12 according to the first embodiment may be a corrugated surface in a side view, as shown in FIG. 28. An arrangement of the guide grooves is not limited to the above examples. An optimum number, size, and arrangement of the guide grooves are determined based on the flow amount of fluid flowing out from the concave part.

Guide grooves according to each of the above embodiments are not necessarily limited to being linear, and may be slightly curved. Specifically, the guide grooves may have a smaller curvature than that of an arc of the opening edge of the concave part or an arc of the outer periphery of the main body when viewed towards the end face or the concave part of the main body. For example, the guide grooves may have half the curvature of an arc of the opening edge of the concave part or an arc of the outer periphery of the main body. In a case that the main body has a square columnar shape, the guide grooves may have a smaller curvature than that of an arc of a circumscribed circle that passes through the apexes on the outer side of the main body when viewed towards the end face or the concave part of the main body.

5-3. Modification 3

On end face 12 of swirl flow-forming body 1 according to the first embodiment, protrusions 71 may be provided to prevent lateral displacement of a conveyed member. The protrusions 71 are examples of a "movement restriction means" according to the present invention. FIG. 29 shows a perspective view of an example of swirl flow-forming body 1A, which is an example of a "suction device" according to the present invention. FIG. 30 shows a bottom view of an example of swirl flow-forming body 1A. Four protrusions 71 shown in these drawings have a cylindrical shape with a sharp tip, and are attached to end face 12 such that the protrusions 71 extend substantially vertically from end face 12. The protrusions 71 are arranged so as to surround a member to which suction is applied by negative pressure. The protrusions 71 shown in the drawings are arranged at equal intervals in the center in the radial direction of end face 12. The protrusions 71 thus configured prevent a member to which suction is applied by negative pressure from moving along end face 12 during high-speed conveyance.

The shape of the protrusions 71 may be a square columnar shape with a sharp tip, or a cone or pyramid shape. The number of the protrusions 71 may be fewer than three, or more than five. The protrusions 71 may be arranged at the outer or inner edge in the radial direction of end face 12. The protrusions 71 may be arranged so as to pierce a member to which suction is applied by negative pressure.

The protrusions 71 may be attached to end face 33 of radial flow-forming body 3 according to the third embodiment.

5-4. Modification 4

FIG. 31 shows a side view of an example of swirl flow-forming body 1B, which is a modification of swirl flow-forming body 1A according to modification 3. Swirl flow-forming body 1B shown in the drawing differs from swirl flow-forming body 1A in that swirl flow-forming body 1B lacks eight guide grooves 16, and that swirl flow-forming body 1B includes the protrusions 71 that are attached to end face 12 via spacer 81. The four spacers 81 provided in swirl flow-forming body 1B are cylindrical and have a diameter larger than that of protrusion 71, and are attached to end face 12 on the same axis as protrusion 71. It is of note that shape of the spacers 81 may be modified to a square columnar shape. The spacers 81, when swirl flow-forming body 1B conveys a member such as a Japanese deep-fried dish while the member is pierced by the protrusions 71, come into contact with a surface of the member, so that the member is prevented from coming into contact with end face 12. Accordingly, a gap is maintained between the member and end face 12. This gap enables outflow of most of the fluid molecules flowing out from the opening of concave part 13, whereby a rate of collision between the outflow fluid and the member is reduced. For these reasons, swirl flow-forming body 1B has the same effect as swirl flow-forming body 1 according to the first embodiment.

5-5. Modification 5

On end face 12 of swirl flow-forming body 1 according to the first embodiment, cylindrical body 91 may be attached to hold a conveyed member. FIG. 32 is a side view of an example of swirl flow-forming body 1C including cylindrical body 91, which is an example of a "suction device" according to the present invention. Cylindrical body 91 shown in the drawing is a bellows-shaped cylindrical body made of an elastic material such as rubber, and is a member for holding a member to which suction is applied by swirl flow-forming body 1C. An end of cylindrical body 91 is fixed on end face 12 such that cylindrical body 91 allows passage of fluid to which suction is applied by negative pressure generated by swirl flow-forming body 1C, and also prevents a conveyed member from entering concave part 13. Specifically, cylindrical body 91 is fixed on end face 12 on the same axis as concave part 13. Cylindrical body 91 has constricted parts whose inner diameter is smaller than the inner diameter of concave part 13 and the maximum diameter of a conveyed member. Another end of cylindrical body 91 is expanded toward a conveyed member. The height of cylindrical body 91 is determined based on the flow amount of fluid supplied from the fluid supply pump to swirl flow-forming body 1C, and on a type of a member to be conveyed. It is of note that the shape of cylindrical body 91 is not limited to being cylindrical, and may be a square or elliptical columnar shape.

According to swirl flow-forming body 1C, cylindrical body 91 restricts inflow of surrounding fluid into swirl flow-forming body 1C applying suction to a member, so that swirl flow-forming body 1C can apply suction to the member positioned away from the negative pressure generation area. The bellows shape of cylindrical body 91 enables cylindrical body 91 to deform according to a shape of a conveyed member; accordingly, in a case where a misalignment occurs between swirl flow-forming body 1C and a conveyed member, swirl flow-forming body 1C can hold the member stably. Also, due to its bellows shape, cylindrical body 91 causes less damage to a conveyed member in the event of contact with the conveyed member. Also, due to the bellows shape of cylindrical body 91, it is easier to secure a vertical clearance between swirl flow-forming body 1C and a conveyed member, because expansion and contraction of cylindrical body 91 compensate for variations in height of members to conveyed. Cylindrical body 91 may have constricted parts whose inner diameter is smaller than or equal to one-half of the inner diameter of concave part 13 of swirl flow-forming body 1C, so that swirl flow-forming body 1C can convey a smaller member.

Cylindrical body 91 may have notches that are formed at an end of cylindrical body 91 at which a conveyed member is held. The shape of the notches may include a sawtooth shape, and a semicircle, semi-oval, or rectangle shape. Swirl flow-forming body 1C may include, instead of cylindrical body 91, plural cylindrical bodies having a smaller diameter than cylindrical body 91, which are attached to end face 12, so that swirl flow-forming body 1C can convey plural members at the same time. Cylindrical body 91 may have a shape other than the bellows shape. Cylindrical body 91 may gradually taper off from the end facing end face 12 to the end facing a conveyed member.

Cylindrical body 91 may be attached to end surface 33 of radial flow forming body 3 according to the third embodiment.

5-6. Modification 6

The swirl flow-forming body or the radial flow-forming body according to each of the above embodiments may be used to apply suction to, hold, and convey a plate-like or sheet-like member such as a semiconductor wafer or a glass substrate, instead of a food. Depending on a size of the member, plural swirl or radial flow-forming bodies that are attached to a plate-like frame may be used (for example, refer to FIGS. 10 and 11 of published unexamined patent application number 2016-159405).

1, 1A, 1B, 1C, 2 . . . swirl flow-forming body, 3, 4 . . . radial flow-forming body, 11 . . . main body, 12 . . . end face, 13 . . . concave part, 14 . . . jetting port, 15 . . . inclined surface, 16 . . . guide groove, 17 . . . supply port, 18 . . . annular passage, 19 . . . communication path, 20 . . . supply path, 21 . . . annular wall, 22 . . . guide groove, 31 . . . main body, 32 . . . annular concave part, 33 . . . end face, 34 . . . opposing surface, 35 . . . inclined surface, 36 . . . guide groove, 37 . . . nozzle passage, 38 . . . introduction port, 39 . . . introduction path, 40 . . . annular passage, 41 . . . communication passage, 42 . . . annular wall, 43, 51, 52, 53, 62, 63 . . . guide groove, 71 . . . protrusion, 81 . . . spacer, 91 . . . cylindrical body, 111 . . . inner-peripheral side surface

The invention claimed is:
1. A suction device comprising:
a cylindrical main body;
an end face formed on the main body;
a concave part formed in the end face, an opening edge of the concave part have a circular shape;
a fluid flow-forming means for forming a fluid swirl flow in the concave part by discharging fluid into the concave part, the fluid swirl flow generating negative pressure that applies suction to a member; and
a plurality of linear guide grooves formed on the end face, each of the plurality of guide grooves being formed along a direction in which the fluid discharged into the concave part flows out of the concave part, the direction forming an angle of less than 45 degrees with respect to a tangent line that passes through a contact point between the guide groove and the opening edge of the concave part when viewed towards the end face.

2. The suction device according to claim 1, wherein:
the fluid flow-forming means is a fluid passage through which the fluid is discharged into the concave part to cause the fluid swirl flow to be formed; and
one of the plurality of guide grooves is formed on the end face, when viewed towards the end face, along a direction that forms an angle of approximately 45 degrees with respect to a direction in which the fluid passage extends.

3. The suction device according to claim 1, wherein the guide groove is formed such that a cross-sectional area of the guide groove increases in proportion to a distance from the concave part.

4. The suction device according to claim 1, wherein the guide groove is formed such that a cross-sectional area of the guide groove decreases in proportion to a distance from the concave part.

5. The suction device according to claim 1, further comprising a movement restriction means provided on the end face, for restricting movement along the end face of the member to which suction is applied by the negative pressure.

6. The suction device according to claim 5, wherein the movement restriction means is a horn-shaped protrusion that restricts movement of the member by piercing the member.

7. A suction device comprising:
a columnar main body;
a concave part formed in a surface of the main body, an opening edge of the concave part having a circular shape;
a fluid flow-forming means for forming a fluid swirl flow in the concave part by discharging fluid into the concave part, the fluid swirl flow generating negative pressure that applies suction to a member;
an annular wall, provided so as to surround the concave part, that prevents the member from entering the concave part, the annular wall being formed such that a thickness of the annular wall gradually decreases towards an end of the annular wall facing the member to be suctioned; and
a plurality of linear guide grooves formed on an inner wall surface of the annular wall, each of the plurality of guide grooves being formed along a direction in which the fluid discharged into the concave part flows out of the concave part, the inner wall surface facing a space in the annular wall, the space being connected to the concave part to form one recess.

8. A suction device comprising:
a columnar main body;
a concave part formed in a surface of the main body, an opening edge of the concave part having a circular shape;
a fluid flow-forming means for forming a fluid swirl flow in the concave part by discharging fluid into the concave part, the fluid swirl flow generating negative pressure that applies suction to a member;
an annular wall, provided so as to surround the concave part, that prevents the member from entering the concave part, the annular wall being formed such that a thickness of the annular wall gradually decreases towards an end of the annular wall facing the member to be suctioned; and
a plurality of curved guide grooves formed on an inner wall surface of the annular wall, each of the plurality of guide grooves being formed along a direction in which the fluid discharged into the concave part flows out of the concave part, the inner wall surface facing a space in the annular wall, the space being connected to the concave part to form one recess, each of the plurality of guide grooves having a curved shape when viewed towards the opening edge of the concave part, a curvature of a curve of each of the plurality of guide grooves being smaller than a curvature of the circular shape of the opening edge of the concave part when viewed towards the opening edge of the concave part.

\* \* \* \* \*